(12) United States Patent
Ogilvie

(10) Patent No.: US 7,190,751 B1
(45) Date of Patent: Mar. 13, 2007

(54) MULTI-STAGE FILTER CIRCUIT AND DIGITAL SIGNAL PROCESSING CIRCUIT EMPLOYING THE SAME

(75) Inventor: Brian K. Ogilvie, Medway, MA (US)

(73) Assignee: LSI Logic Corporation, Milpitas, CA (US)

( * ) Notice: Subject to any disclaimer, the term of this patent is extended or adjusted under 35 U.S.C. 154(b) by 1073 days.

(21) Appl. No.: 09/878,604

(22) Filed: Jun. 11, 2001

(51) Int. Cl.
*H04B 1/10* (2006.01)

(52) U.S. Cl. ...................................... 375/350
(58) Field of Classification Search ................ 375/229, 375/240, 316, 346, 350
See application file for complete search history.

(56) References Cited

U.S. PATENT DOCUMENTS

| | | | |
|---|---|---|---|
| 4,942,466 A * | 7/1990 | Sandbank et al. ..... | 375/240.01 |
| 5,280,353 A * | 1/1994 | Baldwin ..................... | 348/674 |
| 6,064,614 A | 5/2000 | Khoury | |
| 6,125,154 A * | 9/2000 | Sutardja ..................... | 375/345 |
| 6,188,723 B1 | 2/2001 | Lee et al. | |
| 6,208,671 B1 * | 3/2001 | Paulos et al. ............... | 370/545 |
| 6,643,323 B1 * | 11/2003 | Allred ........................ | 375/229 |
| 2003/0019349 A1 * | 1/2003 | Green .......................... | 84/731 |
| 2004/0152965 A1 * | 8/2004 | Diab et al. .................. | 600/323 |

* cited by examiner

*Primary Examiner*—Khai Tran
*Assistant Examiner*—Aslan Ettehadieh
(74) *Attorney, Agent, or Firm*—Hitt Gaines, P.C.

(57) ABSTRACT

The present invention provides a filter circuit, related method of operating the filter circuit and a digital signal processing circuit incorporating the same. In one embodiment, the filter circuit includes a conditioning stage, operable at a rate corresponding to an input signal to be sampled, configured to derive an intermediate signal from the input signal as a function of a parameter. The filter circuit further includes an output stage, operable at a sampling rate, configured to derive a sampled signal as a function of the intermediate signal where the parameter is adapted to govern characteristics of a frequency response associated with the sampled signal.

17 Claims, 4 Drawing Sheets

MULTI-STAGE FILTER CIRCUIT AND DIGITAL SIGNAL PROCESSING CIRCUIT EMPLOYING THE SAME

TECHNICAL FIELD OF THE INVENTION

The present invention is directed, in general, to a digital signal processing and, more specifically, to multi-stage filter circuit, a related method of operation thereof, and a digital signal processing circuit incorporating the same.

BACKGROUND OF THE INVENTION

Digital signal processing has become a mainstream technology employed by designers at the integrated circuit, board and system design levels. The technology is a core ingredient in many technology-related fields including the telecommunications and computer industries. For instance, many mobile phones, modems, digital versatile discs (DVDs), and a myriad of related products depend on digital signal processors ("DSPs") for their basic functionality. DSPs are also effectively employed in audio, video and multimedia peripherals, disk drives and image processing systems for applications such as medical and scientific purposes. As further developments in the DSP technology occur, DSPs will be advantageously employed in a multitude of other applications.

Among the components found in conventional DSPs are signal filters. Employed to filter incoming data signals in a variety of ways, signal filters are being used in an increasing number of electronic devices. One commonly used type of signal filter is a finite impulse response (FIR) filter. A FIR filter is a sampled data filter characterized by its impulse response. Its input signal is a discrete time sequence which may be analog or digital. The output of the FIR filter is also a discrete time sequence, and is the convolution of the input sequence and the filter impulse response based on predetermined coefficients. FIR filters may be implemented in the analog domain or in the digital domain.

Typically, FIR filters used in "upsampling" incoming signals not only boost the signal, but may also average the signal to arrive at the appropriate output signal. Unfortunately, many of the logic devices, such as "adders", in conventional FIR filters operate at the faster clock rate of the upsampled signal in order to provide an accurate frequency response. However, such logic devices designed to operate at these higher frequencies are typically more costly than those that operate at lower frequencies, such as the frequency of the input signal. In addition, those skilled in the art understand the increased power consumption of an FIR filter whose logic devices are operated at such an increased clock rate.

Accordingly, what is needed in the art is a filter circuit that can provide a sampled signal based on an input signal that does not suffer from such deficiencies.

SUMMARY OF THE INVENTION

To address the above-discussed deficiencies of the prior art, the present invention provides a filter circuit including a conditioning stage, operable at a rate corresponding to an input signal to be sampled, configured to derive an intermediate signal from the input signal as a function of a parameter. The filter circuit further includes an output stage, operable at a sampling rate, configured to derive a sampled signal as a function of the intermediate signal where the parameter is adapted to govern characteristics of a frequency response associated with the sampled signal.

In another aspect of the present invention, a method of operating a filter circuit is disclosed. In one embodiment, the method includes receiving an input signal to be sampled, and operating a conditioning stage at a rate corresponding to the input signal. The method also includes deriving an intermediate signal from the input signal as a function of a parameter. In addition, the method still further includes operating an output stage at a sampling rate and deriving a sampled signal as a function of the intermediate signal where the parameter is adapted to govern characteristics of a frequency response associated with the sampled signal.

In yet another aspect, the present invention provides a digital signal processing (DSP) circuit. In one embodiment, the DSP circuit includes an analog-to-digital signal converter, a filter circuit and a digital-to-analog signal converter. In such an embodiment, the filter circuit includes a conditioning stage, operating at a rate corresponding to an input signal to be sampled, deriving an intermediate signal from the input signal as a function of a parameter. The DSP circuit further includes an output stage, operating at a sampling rate, deriving a sampled signal as a function of the intermediate signal where the parameter is governing characteristics of a frequency response associated with the sampled signal.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
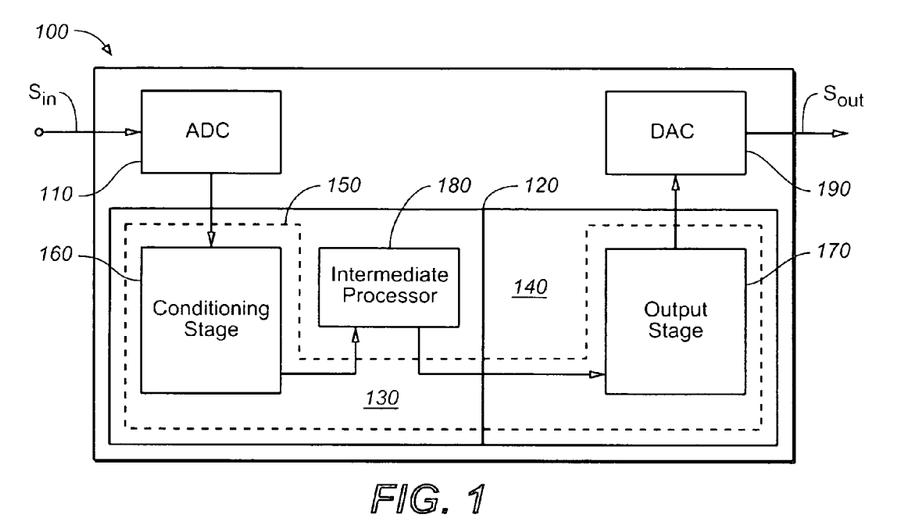
FIG. 1 illustrates a block diagram of a digital signal processing (DSP) circuit, which may provide an environment for a filter circuit constructed according to the principles of the present invention.

Referring initially to FIG. 1, illustrated is a block diagram of a digital signal processing (DSP) circuit 100, which may provide an environment for a filter circuit constructed according to the principles of the present invention. Although only certain components are illustrated in FIG. 1, the DSP circuit 100 may further include greater or fewer components than those illustrated. Those skilled in the art understand the components that may be employed in a DSP circuit, and the present invention is not intended to be limited to any particular type or number of components.

The DSP circuit 100 receives an input signal $S_{in}$, which may be an analog signal generated from a nearby electronic device such as a DVD player or other audio/video equipment. The input signal $S_{in}$ is fed into an analog-to-digital converter (ADC) 110, which converts the input signal $S_{in}$ from an analog signal to a digital data signal. The newly converted digital signal is then fed into a signal processing module 120. In accordance with conventional practice, the signal processing module 120 is divided into two domains, a low speed clock domain 130 and a high speed clock domain 140. A filter circuit [e.g., a finite impulse response (FIR) filter 150] constructed according to the principles of the present invention is located within the signal processing module 120, among other possible components, As illustrated, the FIR filter 150 is divided into a conditioning stage 160 and an output stage 170. According to the principles discussed herein, the conditioning stage 160 may be operated at a low clock speed, based on the clock speed of the input signal $S_{in}$, and is therefore located in the low speed clock domain 130. Conversely, the output stage 170 may be operated at a faster, upsampled clock speed, based on the sampling rate used to derive a resampled output signal $S_{out}$. Thus, the output stage 170 is located in the high speed clock domain 140.

When the digital signal enters the conditioning stage 160, certain operations, which will be described in greater detail below, are performed on it in order to provide boost (e.g., increase a gain) to the signal. This boost is used in an effort to reduce attenuation of the output signal $S_{out}$, which tends to occur at the Nyquist frequency. The conditioning stage 160 generates an intermediate signal based on the above-mentioned operations, and that signal is input to an intermediate processor 180. As illustrated, the intermediate processor 180 is also located in the low speed clock domain 130, allowing the components therein to operate at the lower clock speed of the input signal $S_{in}$. In an exemplary embodiment, the intermediate processor 180 includes several signal processing devices, each of which may operate at the lower clock speed in the low clock speed domain 130.

After the completion of processing operations in the low speed clock domain 130, the signal is then fed into the output stage 170 in the high speed clock domain 140. The output stage 170 then generates a resampled signal, based on its incoming signal, and sends that resampled signal to a digital-to-analog converter (DAC) 190. In one embodiment, the output stage 170 generates an upsampled digital signal twice the amplitude of the input signal $S_{in}$. In a related embodiment, the output stage 170 is constructed in an averaging configuration in order to generate a 2× upsampled signal. Of course, the output stage 170 is not limited to any particular sampling rate or configuration, but rather is broad enough to encompass various degrees of sampling. The DAC 190 converts the resampled digital signal and generates the analog output signal $S_{out}$ for the DSP circuit 100. The resampled output signal $S_{out}$ may then be transmitted to another analog electronic device, such as a television.

Figure 2:
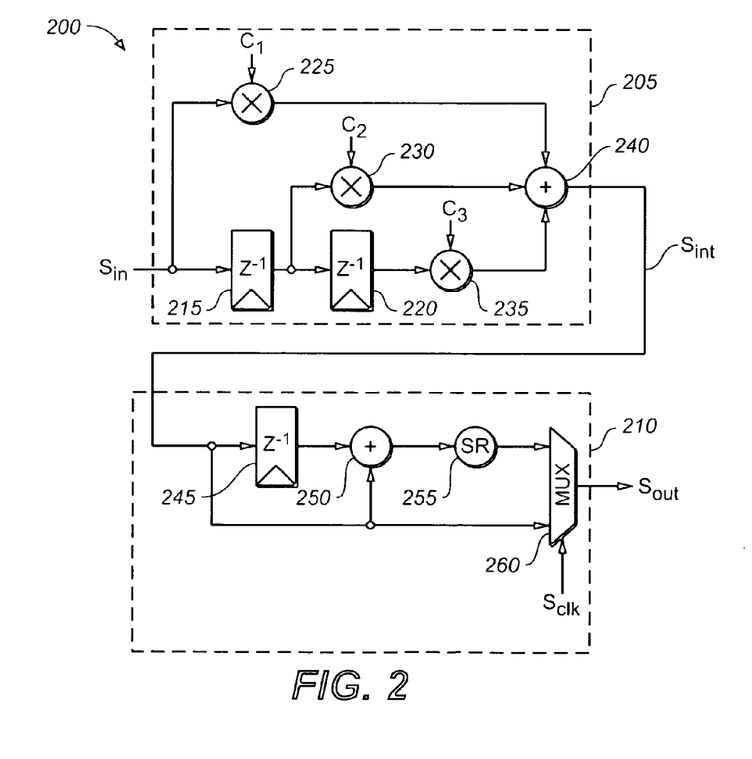
FIG. 2 illustrates a logic diagram of one embodiment of a filter circuit constructed according to the present invention.

Turning now to FIG. 2, illustrated is a logic diagram of one embodiment of a filter circuit constructed according to the present invention. In the illustrated embodiment, the filter circuit is embodied in a finite impulse response (FIR) filter 200. The FIR filter 200 includes a conditioning stage 205 and an output stage 210. In accordance with the principles to be described herein, the conditioning stage 205 provides a boost (e.g., increase a gain) for an incoming signal $S_{in}$, while the output stage 210 provides a final sampled output signal $S_{out}$. The FIR filter 200 functions as follows.

The input signal $S_{in}$ to be sampled enters the conditioning stage 205 of the FIR filter 200 and is split into two signals. One of the newly split signals is input to a first multiplier 225, and may be considered as coming from a first outer tap. The first multiplier 225 includes a first filter coefficient $C_1$ employed to provide an eventual boost, or gain, to the input signal $S_{in}$. The operation of the first multiplier will be described in greater detail with respect to FIGS. 3 and 4. Those skilled in the art understand the desire to provide gain to an input signal so as to increase the signal's final frequency response with respect to the sampling rate.

In an exemplary embodiment, the first filter coefficient $C_1$ may be derived using only a single parameter, as described in detail below, although the present invention is not so limited. The output of the first multiplier 225 is input to a first adder 240. By establishing filter coefficients using the single parameter technique disclosed herein, the logic devices within the conditioning stage 205 may be operated at a clock rate comparable to the input signal $S_{in}$. Thus, only logic devices in the output stage 210 need to be operated at the higher frequency associated with the sampling rate.

The other split signal from the input signal $S_{in}$ is input to a first delay element 215. In accordance with conventional practice, the first delay stage 215 (as well as any other delay stages discussed herein) may be programmed with predetermined values so as to provide a proper sampling of the input signal $S_{in}$. After passing through the first delay element 215, the signal is split between a second delay element 220 and a second multiplier 230. The signal entering the second multiplier 230 encounters a second filter coefficient $C_2$, again to assist in providing gain to the input signal $S_{in}$. This signal may be considered as derived from a central tap. As with the first filter coefficient $C_1$, in an exemplary embodiment, the second filter coefficient $C_2$ may also be derived using a single parameter. The output of the second multiplier 230 is then fed into the first adder 240 along with the output from the first multiplier 225.

The other portion of the signal, once passing through the second delay element 220, is input to a third multiplier 235. This signal may be considered as being derived from a second outer tap. As before, the third multiplier 235 includes a third filter coefficient $C_3$ to further assist in providing gain to the input signal $S_{in}$, and the third coefficient $C_3$ may also be, in an exemplary embodiment, derived from a single parameter. The output from the third multiplier 235 is then fed into the first adder 240 to be summed with the outputs from the first and second multipliers 225, 230. Once the outputs from the three multipliers 225, 230, 235 are summed, the total forms an intermediate signal $S_{int}$, which serves as the input to the output stage 210 of the FIR filter 200.

Figure 3:
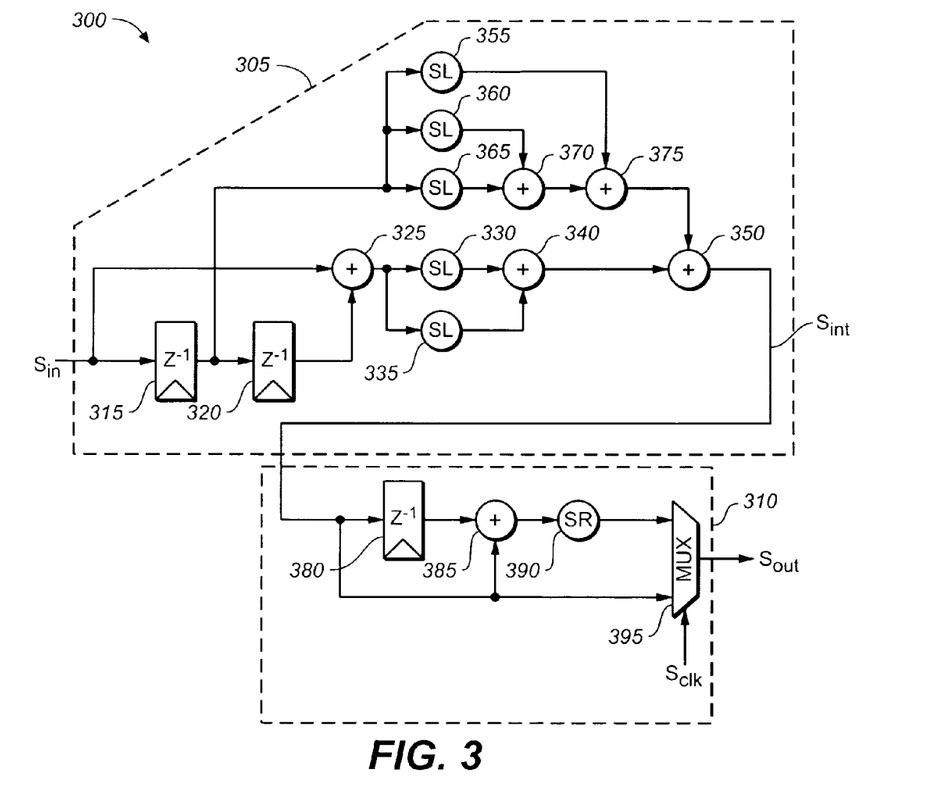
FIG. 3 illustrates a logic diagram of another embodiment of a filter circuit constructed according to the present invention.

To determine the first, second and third filter coefficients $C_1$, $C_2$, $C_3$ and thus to arrive at the intermediate signal $S_{int}$, a single parameter ($\alpha$) may be used in conjunction with the following equations:

$$C_2 = 2^n + 2\alpha$$

$$C_1 = C_3 = -(\alpha)$$

where "n" is the input bit-width. The first and third filter coefficients $C_1$, $C_3$ are used to perform operations on the outer taps, while the second filter coefficient $C_2$ is used to perform operations on the central tap. Using these equations, the multipliers 225, 230, 235 result in the conditioning stage 205 passing the intermediate signal $S_{int}$ with a resampling gain of, for instance, one. The resampling gain for the upsampled output signal $S_{out}$ is thus provided by the output stage 210 since the logic devices of the conditioning stage 205 operate at the slower rate and the logic devices of the output stage 210 operate at the faster sampling rate. In a particularly advantageous embodiment, the layout of the multipliers 225, 230, 235 of the conditioning stage 205 may follow a conventional canonical sign-digit recoding technique. Those skilled in the art are familiar with such techniques, as well as the advantages associated therewith. FIG. 3 illustrates the layout of such a technique.

As mentioned above, the intermediate signal $S_{int}$ is input to the output stage 210 from the conditioning stage 205. In the illustrated embodiment, the output stage 210 is an averaging stage, which may provide a 2× upsampled output signal $S_{out}$. Of course, the output stage 210 may provide other amounts of upsampling, and the present invention is not limited to an averaging stage. In addition, in accordance with the principles of the present invention, the logic devices within the output stage 210 are operated at the faster clock rate (or upsampling rate) associated with the upsampling task of the FIR filter 200. More specifically, of the illustrated logic devices, only a second adder 250 is operated at the increased clock rate. As such, the FIR filter 200 of the present invention provides for an architecture in which many of the logic devices in the FIR filter 200 are not required to operate at the faster clock rate. Those skilled in the art understand the significant savings, in both cost and power consumption, provided when many of the logic devices of an upsampling FIR filter are permitted to operate at the rate of the filter's input signal rather than that of the upsampled output signal.

Once the intermediate signal $S_{int}$ enters the output stage 210, it is split into two signals. One of the split signals is input to a third delay stage 245, and is then input to the second adder 250. The other portion of the split signal bypasses the third delay stage 245, and is input to the second adder 250, as well as directly to a multiplexer 260. As illustrated, the second adder 250 combines the two signal portions and divides the result at a right-shift node 255. Since in the illustrated embodiment the output stage 210 is an averaging stage, the net result of the second adder 250 and the right-shift node 255 is to divide the result of the second adder 250 by two, thus averaging the signals. This average is then input to the multiplexer 260. Employing a clock signal $S_{clk}$ representing the increased clock phase of the output stage 210, the multiplexer 260 selects the now-resampled output signal $S_{out}$ of the FIR filter 200. In the illustrated embodiment, the output signal $S_{out}$ is a 2× upsampled signal based on the input signal $S_{in}$ of the FIR filter 200. Of course, other sampled signals may also be generated by the FIR filter 200.

Looking now at FIG. 3, illustrated is a logic diagram of another embodiment of a filter circuit constructed according to the present invention. As before, the filter circuit of the present invention is illustrated as an FIR filter 300. The embodiment of FIG. 3 illustrates an architecture in which a canonical sign-digit technique is employed for the filter coefficients of a conditioning stage 305 of the FIR filter 300. More specifically, the architecture implements coefficient recoding such that the multiplication by filter coefficients (such as the first, second and third filter coefficients $C_1$, $C_2$, $C_3$ discussed above with respect to FIG. 2) is accomplished by first, second, third, fourth and fifth left-shift nodes 330, 335, 355, 360, 365 and by first, second, third, fourth and fifth adders 325, 340, 350, 370, 375. Thus, multipliers, such as those described with respect to FIG. 2, may be more specifically illustrated using the left-shift nodes 330, 335, 355, 360, 365 and adders 325, 340, 350, 370, 375 illustrated in FIG. 3.

An input signal $S_{in}$ to be sampled is fed into the conditioning stage 305, and is split into two signals. One of the signals is fed into a first delay stage 315, while the other signal is tapped out and fed into the first adder 325. The first adder 325 is weighted by canonical sign-digit recoding representing a first filter coefficient. An output of the first delay stage 315 is then split into two signals as well, where one signal is fed into a second delay stage 320 and the other is tapped out and fed into the third, fourth and fifth left-shift nodes 355, 360, 365. This tapped out signal represents a central tap on which operations associated with a second filter coefficient will be performed. More specifically, in the illustrated embodiment, this operation is implemented by the third, fourth and fifth left-shift nodes 355, 360, 365 and the fourth and fifth adders 370, 375.

An output of the second delay stage 320, representing the other outer tap and on which operations associated with a third filter coefficient will be performed, is fed into the first adder 325. The outer tapped signals are summed by the first adder 325 and fed into the first and second left-shift nodes 330, 335. The first and second left-shift nodes 330, 335 and the first, second and third adders 325, 340, 350 perform operations associated with the first and third coefficients. The first and third coefficients are equal as evidenced by the use of the first adder 325, which simply combines the outer taps' signals and allows only one set of operations to be performed. In alternative embodiments, the first adder 325 may be removed, and the operations carried out by first and second left-shift nodes 330, 335, as well as the second adder 340, executed for each of the outer taps.

The first and second left-shift nodes 330, 335 shift their respective signals to the left by their own predetermined value. As a result, the outputs of the first and second left-shift nodes 330, 335 have been shifted differently, and those outputs are summed by the second adder 340. These multiple operations are defined by the single parameter ($\alpha$), and vary based on the selected parameter $\alpha$. The summed signal arrives at the third adder 350 to be combine later with the results from the operations executed on the central tap.

Returning to the signal tapped out between the first and second delay stages 315, 320 (the central tap), that signal is fed into the third, fourth and fifth left-shift nodes 355, 360, 365, as mentioned above. Each of the third, fourth and fifth left-shift nodes 355, 360, 365 shifts their respective signals to the left by their own predetermined value. Once the third left-shift node 355 shifts its signal, that shifted signal is fed into the fifth adder 375. The shifted signal from the fourth node 360 is fed into the fourth adder 370, along with the shifted signal from the fifth node 365. These two signals are summed by the fourth adder 370 and the result is fed into the fifth adder 375, which sums this signal with the shifted signal from the third left-shift node 355. The summed signal is then fed into the third adder 350 to be summed with the shifted signals from the first and second left-shift nodes 330, 335 summed by the second adder 340.

The summed signal output by the third adder 350 is an intermediate signal $S_{int}$, which in essence was derived from the two equations listed above where in the illustrated embodiment the parameter α has not been selected as a power of two. For instance, for the parameter α equaling 31, the filter coefficients would be (−31, 318, −31) which may be implemented as [(−32+1), (256+64−2), (−32+1)] in canonical sign-digit representation. The intermediate signal $S_{int}$ is input to an output stage 310 comparable to the output stage 210 for the FIR filter 200 discussed with respect to FIG. 2. As such, the output stage 310 is illustrated as an averaging stage, and its function is analogous to that of the output stage 210 described above. A third delay stage 380, a sixth adder 385, a right-shift node 390, and a multiplexer 395 determine an output signal $S_{out}$ for the FIR filter 300. More specifically, the multiplexer 395, using a signal $S_{clk}$ representing the sampling rate of the FIR filter 300 (e.g., increased clock phase), generates the resampled output signal $S_{out}$ based on an averaged signal derived from the intermediate signal $S_{int}$, in the same manner as described with respect to the output stage 210 of FIG. 2.

As illustrated by the more specific embodiment illustrated in FIG. 3, numerous adders, as well as other logic devices, are implemented in an FIR filter. However, in accordance with the principles of the present invention, logic devices such as the first, second, third, fourth and fifth adders 325, 340, 350, 370, 375, located in the conditioning stage 305, are operable at the clock rate of the input signal $S_{in}$. As such, only logic devices in the output stage 310, for instance the sixth adder 385, are operated at the faster sampling rate. This dichotomy of operable clock rates within a single FIR filter constructed according to the present invention is a significant improvement over FIR filters found in the prior art. Those skilled in the art understand that conventional FIR filters operate logic devices such as adders at the faster sampling rate. As mentioned above, such operation may significantly increases the cost of the overall FIR filter, as well as the FIR filter's power consumption. Therefore, an FIR filter manufactured according to the present invention enjoys substantial utility in that it may be manufactured at a reduced cost, and operated in a more efficient manner than those FIR filters found in the prior art.

Figure 4:
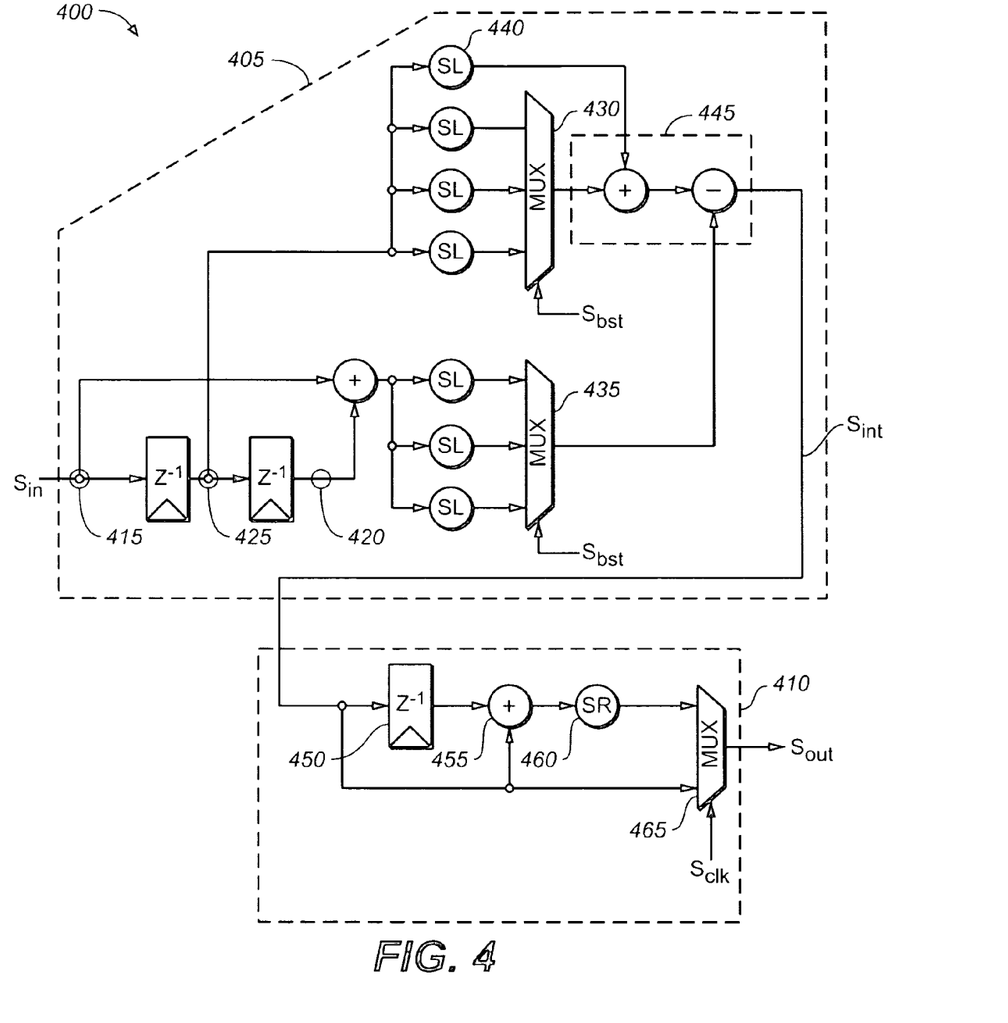
FIG. 4 illustrates a logic diagram of yet another embodiment of a filter circuit constructed according to the present invention.

Referring now to FIG. 4, illustrated is a logic diagram of yet another embodiment of a filter circuit constructed according to the present invention, also embodied in an FIR filter 400. The FIR filter 400 of FIG. 4 is a particularly advantageous embodiment of the present invention in that the single parameter α has been selected as a power of two (wherein the parameter α=$2^m$, where m<n and n is the bit-width of the signal to be sampled).

As with the embodiment illustrated in FIGS. 2 and 3, the FIR filter 400 includes a conditioning stage 405 and an output stage 410. Also as before, the FIR filter 400 includes signals generated from first and second outer taps 415, 420, as well as a signal generated from a central tap 425. The signals from the outer taps 415, 420 are again combined before operations associated with first or third filter coefficients are performed thereon. The signal from the central tap 425 also undergoes its own operations based on a separate filter coefficient.

The FIR filter 400 now also includes first and second multiplexers 430, 435 corresponding to the central tap 425 and the outer taps 415, 420, respectively. With this configuration, the amount of boost (e.g., increasing the gain) in the overall FIR filter 400 may then be controlled by selecting the two multiplexers 430, 435 in parallel. This selection may be accomplished using boost selection signals $S_{bst}$ input to the multiplexers 430, 435 by a user. In alternative embodiments, the boost selection signals $S_{bst}$ may be predetermined, or even selected by a controller. The present invention is not limited to either embodiment.

As illustrated, the first multiplexer 430 for the signal from the central tap 425 is configured to preferably have one extra bit of left-shift (left-shift node 440) when compared to the second multiplexer 435. Since the filter coefficient for the central tap 425 may be selected according to $2^n+2α$, the single parameter α of the present invention may be implemented by simply selecting the parameter α as a power of two ($2^m$). As such, the extra left-shift node 440 accomplishes this, and thus arrives at the simplified architecture illustrated in FIG. 4.

The selection of the first and second multiplexers 430, 435 arrives at two signals, which are fed into an adder/subtracter 445. The adder/subtracter 445 then generates an intermediate signal $S_{int}$ to be fed into the output stage 410, analogous to those described above. As such, a delay stage 450, an adder 455, a right-shift node 460, and a third multiplexer 465 determine a resampled output signal $S_{out}$ for the FIR filter 400. The third multiplexer 465, using a signal $S_{clk}$ representing the sampling rate of the FIR filter 400, generates the output signal $S_{out}$ based on an averaged signal derived from the intermediate signal $S_{int}$, in the same manner as described above. Again, however, the output stage 410 is not limited to an averaging stage.

Figure 5:
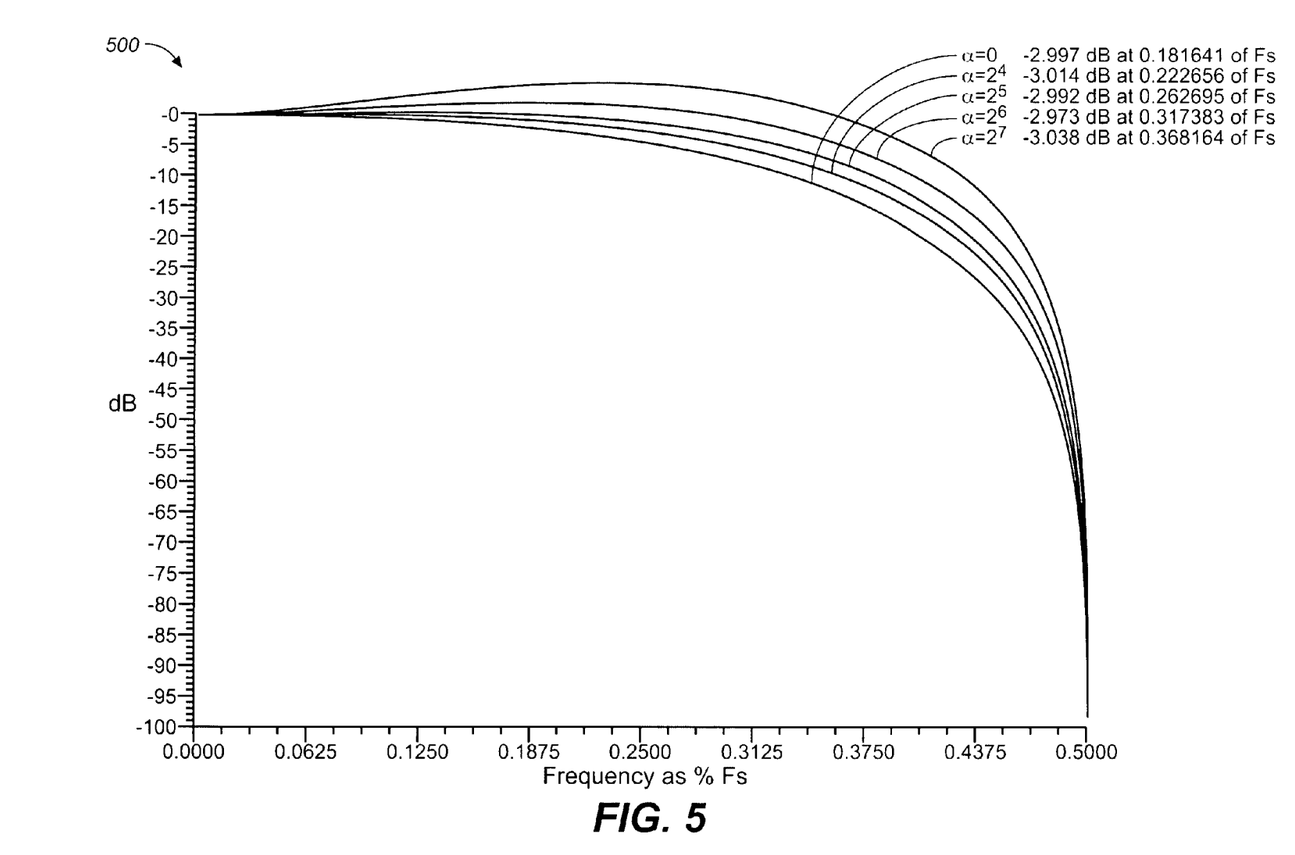
FIG. 5 illustrates a plot of the frequency response associated with the filter circuit of FIG. 4.

Turning finally to FIG. 5, illustrated is a plot 500 of the frequency response associated with the filter circuit of FIG. 4. Several different values have been chosen and plotted using the waveforms illustrated. Those values representing the parameter α are α=0, α=$2^4$, α=$2^5$, α=$2^6$ and α=$2^7$, and may be used in the equations discussed above. The frequency response for these values of the parameter α are illustrated by plotting the gain (in dB) along the ordinate, and plotting the frequency of the input signal as a function of the sampling frequency (Fs) along the abscissa. In the illustrated embodiment, the sampling frequency is 2× the input frequency, thus providing the overall frequency responses for the input signal to a maximum frequency of 0.5 Fs.

Those skilled in the art understand that, ideally, the waveforms in this embodiment should illustrate a rectangular shape, along a 0 dB line and coming straight down at 0.5 Fs. Of course, those skilled in the art also understand that in practical applications there exist problems that tends to attenuate the frequency response of a signal as it approaches the maximum input frequency (0.5 Fs, in this example). Thus, filters, such as an upsampling FIR filter, are employed to provide boost (e.g., increase a gain) to the input signal in an attempt to compensate for the signal loss as the signal approaches the maximum input frequency. However, too much boost in the signal results in distorting affects on a signal having a frequency closer to the minimum input frequency. Thus, the results illustrated in FIG. 5 demonstrate the frequency response provided by several values for the single parameter technique employed in a two stage FIR filter constructed according to the principles of the present invention.

When the parameter α=0 illustrates the frequency response that occurs when no boost to the input signal is provided. As shown, the signal begins to attenuate at low input frequencies (about 0.1 Fs), and continues to worsen as the signal approaches the maximum frequency. When the parameter α=$2^4$, the frequency response of the signal is significantly improved, and does not begin to attenuate until about 0.15 Fs input frequency. In addition, the signal demonstrates a gain of −3.014 dB at 0.222656 of Fs. When the parameter α=$2^5$, the frequency response of the signal is significantly improved, and does not begin to attenuate until about 0.2 Fs input frequency. In addition, the signal demonstrates a gain of −2.992 dB at 0.262695 of Fs. When the parameter α=$2^6$, the signal does not begin to attenuate until about 0.25 Fs input frequency. With the input parameter set here, the signal demonstrates a gain of −2.973 dB at 0.317383 of Fs. Finally, when the parameter α=$2^7$, the signal demonstrates a gain of −3.038 dB at 0.368164 of Fs. As illustrated by the plot 500, the flattest overall frequency response of the FIR filter 400, where the parameter α is chosen as a power of two, occurs in an embodiment wherein the parameter α=$2^5$. Of course, depending on the results desired (which may vary based on the sampling rate) other embodiments employing other values for the single parameter of the present invention may be constructed.

For a better understanding of filter circuits, including FIR filters, see *Electronic Filter Design Handbook*, by Arthur B. Williams and Fred J. Taylor, McGraw Hill, $3^{rd}$ Edition, 1995, which is incorporated herein by reference.

Although the present invention has been described in detail, those skilled in the art should understand that they can make various changes, substitutions and alterations herein without departing from the spirit and scope of the invention in its broadest form.

What is claimed is:

1. A digital signal processing circuit, comprising:
   an analog-to-digital signal converter producing a digitized input signal;
   a filter circuit, including:
      a conditioning stage, operating at a rate corresponding to an input signal to be sampled, deriving an intermediate signal from said input signal as a function of a single adjustable parameter α adapted to determine an operating characteristic of said conditioning stage, where α is used to determine filter coefficients $C_1$, $C_2$ and $C_3$ according to the relationships $C_1$=−α, $C_2$=$2^n$+2α, and $C_3$=$C_1$, where n is a bit width of said input signal; and
      an output stage, operating at a sampling rate, deriving a sampled signal as a function of said intermediate signal, said parameter further adapted to govern characteristics of a frequency response associated with said sampled signal; and
      a digital-to-analog signal converter that produces an analog output signal based on said sampled signal.

2. The digital signal processing circuit as recited in claim 1 wherein said characteristics comprise a gain and bandwidth of said frequency response.

3. The digital signal processing circuit as recited in claim 1 wherein said conditioning stage increases a gain of said input signal.

4. The digital signal processing circuit as recited in claim 1 wherein said conditioning stage comprises multiple taps with associated coefficients selected as a function of said parameter.

5. The digital signal processing circuit as recited in claim 1 wherein said conditioning stage comprises a plurality of delay elements coupled to intervening taps with associated coefficients and an adder.

6. The digital signal processing circuit as recited in claim 1 wherein said sampling rate is greater than said rate.

7. A filter circuit, comprising:
   a conditioning stage that samples an input signal at a first rate and produces an intermediate signal, comprising:
      a plurality of delay/multiplier pairs, each comprising a delay element, a multiplier,
      a final multiplier and
      a summing node; and
   an output stage that samples said intermediate signal at a second rate and produces a output signal,
   wherein a first delay/multiplier pair of said plurality is configured to accept said input signal, a subsequent delay/multiplier pair of said plurality is configured to accept an output of a delay element of a previous delay/multiplier pair, and said final multiplier is configured to accept an output of a delay element of a last one of said plurality, and said summing node is configured to add outputs of said multiplier of each said pair to an output of said final multiplier
   wherein said plurality comprises two delay/multiplier pairs, a first pair having a first multiplier and a first delay element and a second pair having a second multiplier and a second delay element, said first pair being configured to receive said input signal, and said second pair configured to receive an output of said first delay element
   wherein said first multiplier is configured to scale an input thereto by a coefficient $C_1$, said second multiplier is configured to scale an input thereto by a coefficient $C_2$, and said final multiplier is configured to scale an input thereto by a coefficient $C_3$, where $C_1$, $C_2$ and $C_3$ are determined by a single adjustable parameter α according to the relationships $C_1$=−α

$C_2$=$2^n$+2α

$C_3$=$C_1$ where n is a bit-width of said input signal.

8. The filter circuit as recited in claim 7 wherein said plurality of delay/multiplier pairs numbers two pairs.

9. The filter circuit as recited in claim 7 wherein said second multiplier comprises a first, a second and a third shift-left node, each shift-left node configured to receive said output of said first delay element, a first adder configured to add an output of said first and said second shift-left nodes, and a second adder configured to add an output of said first adder and an output of said third shift-left node.

10. The filter circuit as recited in claim 7 wherein said first multiplier and said last multiplier are implemented as a single multiplier circuit comprising:
    a fourth shift-left node and a fifth shift-left node, said fourth and fifth shift-left nodes configured to receive a signal comprising said input signal; and
    an adder configured to add an output of said fourth shift-left node and an output of said fifth shift-left node.

11. The filter circuit as recited in claim 8, further comprising an output stage comprising:
    an output stage delay element configured to receive said intermediate signal;

an output stage adder configured to add said intermediate signal and an output of said output stage delay element;

a divider configured to receive an output of said output stage adder; and a multiplexer configured to receive said intermediate signal and an output of said divider and provide an upsampled output signal.

12. A method of operating a filter circuit, comprising:

receiving an input signal to be sampled; and conditioning said input signal by:

multiplying said input signal by a first coefficient $C_1$ to produce a first product and delaying said input signal to produce a delayed input signal;

multiplying said delayed input signal by a second coefficient C2 to produce a second product and delaying said delayed input signal to produce a twice-delayed signal;

multiplying said twice-delayed signal by a third coefficient C3 to produce a third product; and summing said first, second and third products to produce an intermediate signal, wherein a single adjustable parameter is used to determine $C_1$, $C_2$ and $C_3$.

wherein said single adjustable parameter is $\alpha$, used to determine filter coefficients according to the relationships $$C_1 = -\alpha$$

$$C_2 = 2^n + 2\alpha$$

$$C_3 = C_1$$

where n is a bit-width of said input signal.

13. The method as recited in claim 12 wherein said input signal is added to said twice-delayed signal before being multiplied by said first coefficient.

14. The method as recited in claim 12 wherein multiplication of said delayed input signal is performed by adding a first left-shifted delayed input signal to a sum of a second left-shifted delayed input signal and a third left-shifted delayed input signal.

15. The method as recited in claim 13 wherein multiplication of said input signal is performed by left-shifting a signal comprising said input signal with a first and a second left-shifter, and adding outputs of said first and said second left-shifters.

16. The method as recited in claim 15 wherein said signal comprising said input signal further comprises a twice-delayed input signal.

17. The method as recited in claim 12 wherein said multiplexing is performed at a rate greater than a rate of sampling of said input signal.

* * * * *